United States Patent
Voutsas

(10) Patent No.: US 6,635,555 B2
(45) Date of Patent: *Oct. 21, 2003

(54) METHOD OF CONTROLLING CRYSTALLOGRAPHIC ORIENTATION IN LASER-ANNEALED POLYCRYSTALLINE SILICON FILMS

(75) Inventor: Apostolos Voutsas, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/796,345

(22) Filed: Feb. 28, 2001

(65) Prior Publication Data

US 2002/0119644 A1 Aug. 29, 2002

(51) Int. Cl.[7] ............... C30B 13/00; C30B 21/04; C30B 28/08; H01L 21/36; H01L 21/20
(52) U.S. Cl. ............... 438/487; 438/500; 117/43; 117/46; 117/50
(58) Field of Search ............... 438/487, 500; 117/904, 43, 46, 50

(56) References Cited

U.S. PATENT DOCUMENTS

| | | | | |
|---|---|---|---|---|
| 5,943,560 A | * | 8/1999 | Chang et al. | 438/151 |
| 6,190,949 B1 | * | 2/2001 | Noguchi et al. | 438/149 |
| 6,274,888 B1 | | 8/2001 | Suzuki et al. | 257/72 |
| 6,426,246 B1 | | 7/2002 | Chang et al. | 438/166 |

FOREIGN PATENT DOCUMENTS

WO WO97/45827 12/1997

OTHER PUBLICATIONS

Sposili et al. "Sequential lateral solidification of thin silicon films on SiO2" Applied Physics Letters 69(19) Nov. 4, 1996, pp. 2864–2866.*

Toet, et al. "Laser crystallization and structural characterization of hydrogenated amorphous silicon thin films" Journal of Applied Physics 85(11), Jun. 1, 1999, pp. 7914–7918.*

Fork, et al. "Capillary waves in pulsed excimer laser crystallized amorphous silicon" Applied Physics Letters 68(15), Apr. 8, 1996, pp. 2138–2140.*

Article entitled, "Controlled Super–Lateral Growth of Si Films for Microstructural Manipulation and Optimization", by J.S. Im, M.A. Crowder, R. S. Sposili, J. P. Leonard, H. J. Kim, J. H. Yoon, V. V. Gupta, H. Jin Song and H. S. Cho, published in Phys. Stat. Sol. (a) 166, 1998, pp. 603–617.

Article entitled, "Phase Transformation Mechanisms Involved in Excimer Laser Crystallization of Amorphous Silicon Films", by J. S. Im, H. J. Kim and M. O. Thompson, published in Apply. Phys. Letter 63 (14), Oct. 4, 1993, pp. 1969–1971.

Article entitled, "Sequential Lateral Solidification of Thin Silicon Films on SiO$_2$", by R. S. Sposili and J. S. Im, published in Appl. Phys. Lett. 69 (19) Nov. 4, 1996, pp. 2864–2866.

Article entitle, "Grain populations in laser–crystallized silicon thin films on glass substrates," by M. Nerding et al. published in Thin Solid Films, vol. 383, Issues 1–2, Feb. 15, 2001, pp. 110–112.

* cited by examiner

Primary Examiner—Erik Kielin
(74) Attorney, Agent, or Firm—David C. Ripma; Matthew D. Rabdau; Scott C. Krieger

(57) ABSTRACT

A method is provided to produce thin polycrystalline films having a single predominant crystal orientation. The method is well suited to the production of films for use in production of thin film transistors (TFTs). A layer of amorphous silicon is deposited over a substrate to a thickness suitable for producing a desired crystal orientation. Lateral-seeded excimer laser annealing (LS-ELA) is used to crystallize the amorphous silicon to form a film with a preferred crystal orientation. The crystallized film is then polished to a desired thickness for subsequent processing.

6 Claims, 4 Drawing Sheets

METHOD OF CONTROLLING CRYSTALLOGRAPHIC ORIENTATION IN LASER-ANNEALED POLYCRYSTALLINE SILICON FILMS

BACKGROUND OF THE INVENTION

This invention relates generally to semiconductor technology and more particularly to the method of forming polycrystalline silicon regions within an amorphous silicon film.

Polycrystalline silicon is formed by crystallizing amorphous silicon films. One method of crystallizing amorphous silicon films is Excimer Laser Annealing (ELA). Conventional ELA processes form polycrystalline films having a random polycrystalline structure. Random, as used here, means that no single crystal orientation is dominant and that polycrystalline structures consist of a mixture of crystallographic orientations in silicon. These crystallographic orientations in silicon are commonly denoted as <111>, <110>, and <100>, along with their respective corollaries, as is well known in the art. Control of crystallographic orientation is generally desirable because the electrical characteristics of a polycrystalline silicon film depend upon the crystallographic orientation of the film. In addition, the uniformity of the electrical characteristics will improve if the majority of the film has a controllable texture.

ELA, as well as many other annealing methods, has not provided a means to control these microstructural characteristics and achieve a predictable and repeatable preferential crystal orientation and film texture within an annealed film. It would be desirable to have a method of producing a more uniform crystallographic orientation within a polycrystalline silicon film. It would also be desirable to be able to select a desired crystallographic orientation.

SUMMARY OF THE INVENTION

Accordingly, a method of forming a polycrystalline silicon film with a desired predominant crystal orientation is provided. The method of forming polycrystalline films on a substrate comprises the steps of: providing a substrate, depositing an amorphous silicon film on the substrate, annealing the substrate to produce a polycrytstalline film with the desired predominant crystal orientation, preferably a <100> crystal orientation, and polishing the polycrystalline film to prepare the film for further processing.

The substrate can be any material which is compatible with the deposition of amorphous silicon and excimer laser annealing. For display applications, the substrate is preferably a transparent substrate such as quartz, glass or plastic.

To achieve a good quality film that is predominantly <100> crystal orientation, the step of depositing the amorphous film should deposit to a thickness of at least approximately 100 nm.

The step of annealing preferably uses a laterally seeded excimer laser annealing process. The step of polishing can be accomplished by any means that would not significantly modify the crystal orientation of the film, including by chemical mechanical polishing. For some applications a final film thickness of less than 60 nm is desirable.

The method of the present invention, produces a prepared substrate comprising a polycrystalline film, which has a predominantly <100> crystal orientation, overlying a carrier substrate. The final film is preferably less than 60 nm thick. For display applications, as discussed above, the carrier substrate is preferably a transparent material such as quartz, glass or plastic.

DETAILED DESCRIPTION OF THE INVENTION

Figure 1:
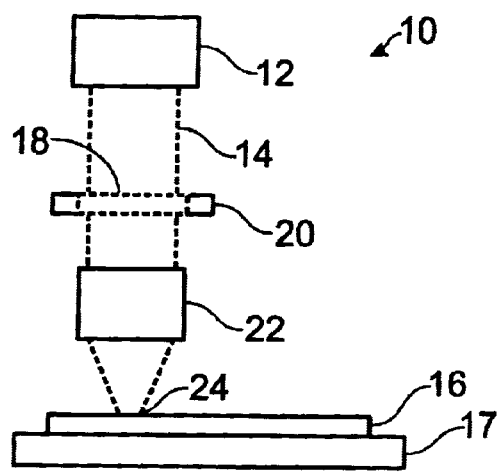
FIG. 1 is a schematic cross-sectional view showing an excimer laser anneal (ELA) apparatus used in connection with the present method.

Referring to FIG. 1 a lateral-seeded excimer laser annealing (LS-ELA) apparatus 10 is shown. LS-ELA apparatus 10 has a laser source 12. Laser source 12 includes a laser (not shown) along with optics, including mirrors and lens, which shape a laser beam 14 (shown by dotted lines) and direct it toward a substrate 16, which is supported by a stage 17. The laser beam 14 passes through a mask 18 supported by a mask holder 20. The laser beam 14 preferably has an output energy in the range of 0.8 to 1 Joule when the mask 18 is 50 mm×50 mm. Currently available commercial lasers such as Lambda Steel 1000 can achieve this output. As the power of available lasers increases, the energy of the laser beam 14 will be able to be higher, and the mask size will be able to increase as well. After passing through the mask 18, the laser beam 14 passes through demagnification optics 22 (shown schematically). The demagnification optics 22 reduce the size of the laser beam reducing the size of any image produced after passing through the mask 18, and simultaneously increasing the intensity of the optical energy striking the substrate 16 at a desired location 24. The demagnification is typically on the order of between 3× and 7× reduction, preferably a 5× reduction, in image size. For a 5× reduction the image of the mask 18 striking the surface at the location 24 has 25 times less total area than the mask, correspondingly increasing the energy density of the laser beam 14 at the location 24.

The stage 17 is preferably a precision x-y stage that can accurately position the substrate 16 under the beam 14. The stage 17 is preferably capable of motion along the z-axis, enabling it to move up and down to assist in focusing or defocusing the image of the mask 18 produced by the laser beam 14 at the location 24. The mask holder 20 is also capable of x-y movement.

Figure 2:
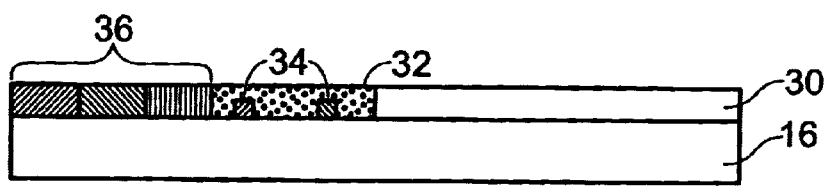
FIG. 2 (prior art) is a cross-sectional view showing polycrystalline film crystallized using an interface-seeded ELA (IS-ELA) process

FIG. 2 illustrates aspects of a prior art ELA process. This process is sometimes referred to as Interface-Seeded ELA (IS-ELA). An amorphous silicon film 30 has been deposited over the substrate 16. A laser pulse is directed at the amorphous silicon film 30, which melts and crystallizes a region 32. The laser pulse melts a region on the order of 0.5 mm. Small microcrystalline seeds 34 remain, or form, at the interface. As the surrounding amorphous silicon crystallizes these seeds affect the crystal orientation. Since the seeds 34 have a variety of crystal orientations, the resulting films will accordingly have a wide mix of crystal orientations. This is illustrated by previously crystallized region 36. In actuality, since a large number of seeds would be present at the interface, a large number of crystal orientations would form.

Figure 3:
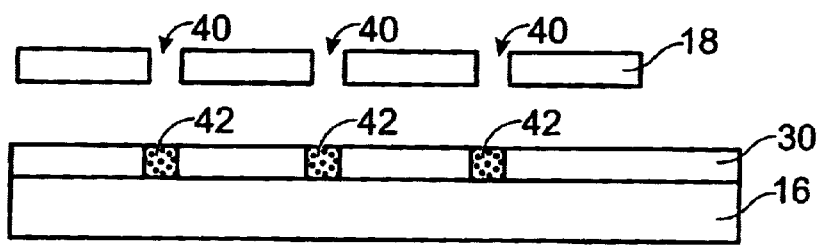
FIG. 3 illustrates a step in the process of lateral-seeded ELA (LS-ELA).
Figure 4:
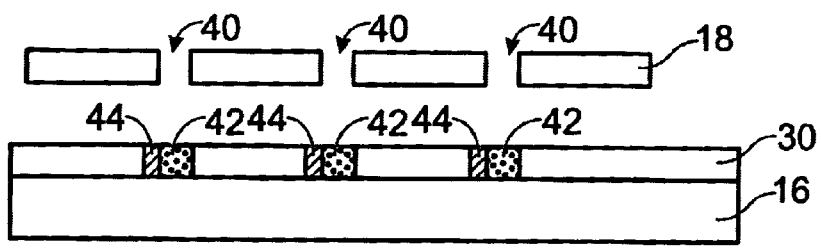
FIG. 4 illustrates a step in the process of lateral-seeded ELA (LS-ELA).
Figure 5:
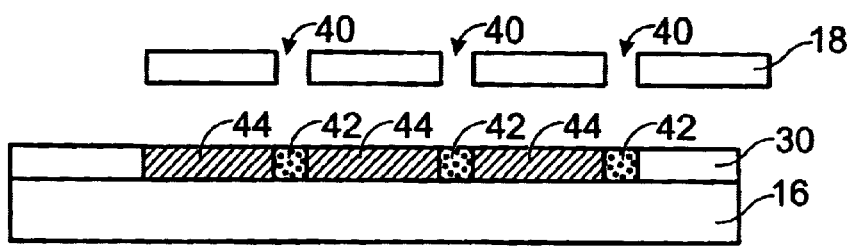
FIG. 5 illustrates a step in the process of lateral-seeded ELA (LS-ELA).

FIGS. 3 through 5 illustrate the steps of Lateral-Seeded ELA (LS-ELA), which is also referred to as Lateral-Growth ELA (LG-ELA) or Lateral Crystallization ELA (LC-ELA). Starting with FIG. 3, the amorphous silicon film 30 has been deposited over the substrate 16. A laser beam pulse has been passed through openings 40 in the mask 18 to form beamlets, which irradiate regions 42 of the amorphous silicon film 30. Each beamlet is on the order of 5 microns wide. This is approximately 100 times narrower than the 0.5 mm used in the prior art IS-ELA process. The small regions 42 are melted and crystallized by the beamlets produced by the laser pulse passing through the mask.

After each pulse the mask 18 is advanced by an amount not greater than half the lateral crystal growth distance. A subsequent pulse is then directed at the new area. By advancing the image of the openings 40 a small distance, the crystals produced by preceding steps act as seed crystals for subsequent crystallization of adjacent material. Referring now to FIG. 4, the irradiated regions 42 have moved slightly. The previously crystallized regions 44 act as the seed crystal for the crystallization of the irradiated regions 42. By repeating the process of advancing the mask laterally and firing short pulses the crystal is effectively pulled in the direction of the advancing laser pulses.

FIG. 5 shows the amorphous silicon film 30 after several additional pulses following FIG. 4. The crystals have continued to grow in the direction of the masks' movement to form a polycrystalline region. The mask will preferably advance until each opening 40 reaches the edge of a polycrystalline region formed by the opening immediately preceding it. To crystallize larger regions, the stage 17, which was described in reference to FIG. 1, can be moved, and the mask 18 repositioned, to continue crystallizing the amorphous silicon film 30 until a region of the desired size has been crystallized.

This LS-ELA process produces crystallized regions that are more uniform, due to the propagation of a first crystallized region by subsequent laser pulses, as opposed to crystallized regions formed using multiple seed crystals at the interface. FIGS. 6 through 9 are plots that illustrate the affect of amorphous silicon film thickness on the resulting predominant crystal orientation.

Figure 6:
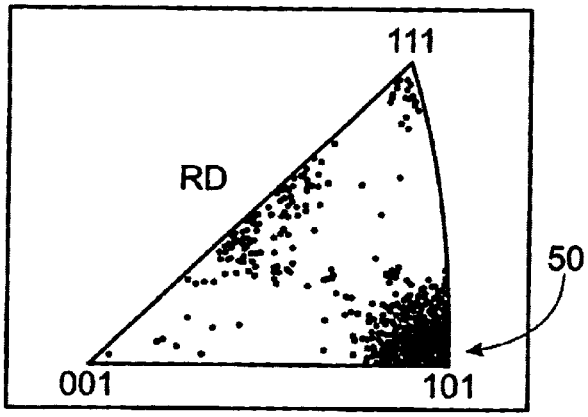
FIG. 6 is a scatter plot of crystal orientations in the rolling direction for a 35 nm thick film.

FIG. 6 is a plot of the distribution of crystal orientation in the rolling direction (RD), which is also referred to as the scanning direction, for a 30 nm thick deposited amorphous silicon film after LS-ELA processing. FIG. 6 shows that a majority of the crystals are in a 101 region 50. The 101 region 50 corresponds to a <110> crystal orientation.

Figure 7:
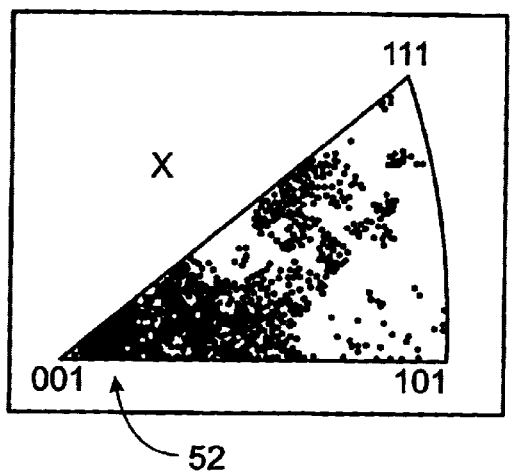
FIG. 7 is a scatter plot of crystal orientations in the rolling direction for a 45 nm thick film.

FIG. 7 is a plot of the distribution of crystal orientation for a 45 nm thick deposited amorphous silicon film after LS-ELA processing. FIG. 7 shows that the crystal orientations are spread throughout the orientation plot. This is a less ideal condition for the resulting film. It should be noted that the predominant crystal orientation has shifted away from the <110> orientation toward the <100> orientation region 52, which corresponds to 001 on the plot.

Figure 8:
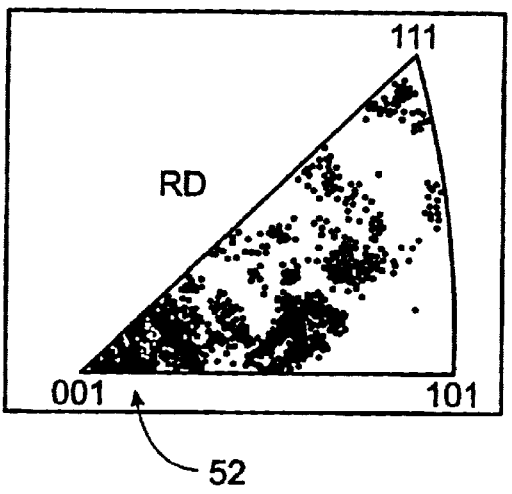
FIG. 8 is a scatter plot of crystal orientations in the rolling direction for a 75 nm thick film.

FIG. 8 is a plot of the distribution of crystal orientation for a 75 nm thick deposited amorphous silicon film after LS-ELA processing. FIG. 8 shows that the crystal orientation has moved closer to the <100> orientation. However, the crystal orientation is still spread over a relatively wide range of crystal orientations.

Figure 9:
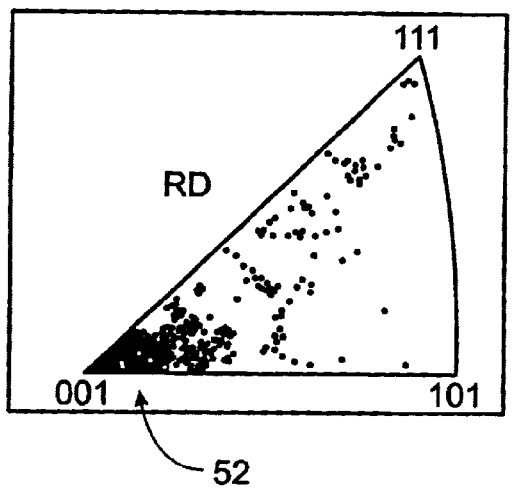
FIG. 9 is a scatter plot of crystal orientations in the rolling direction for a 100 nm thick film.

FIG. 9 is a plot of the distribution of crystal orientation for a 100 nm thick deposited amorphous silicon film after LS-ELA processing. FIG. 9 shows that the crystal orientation is now predominantly <100> as shown by the <100> region 52.

Figure 10:
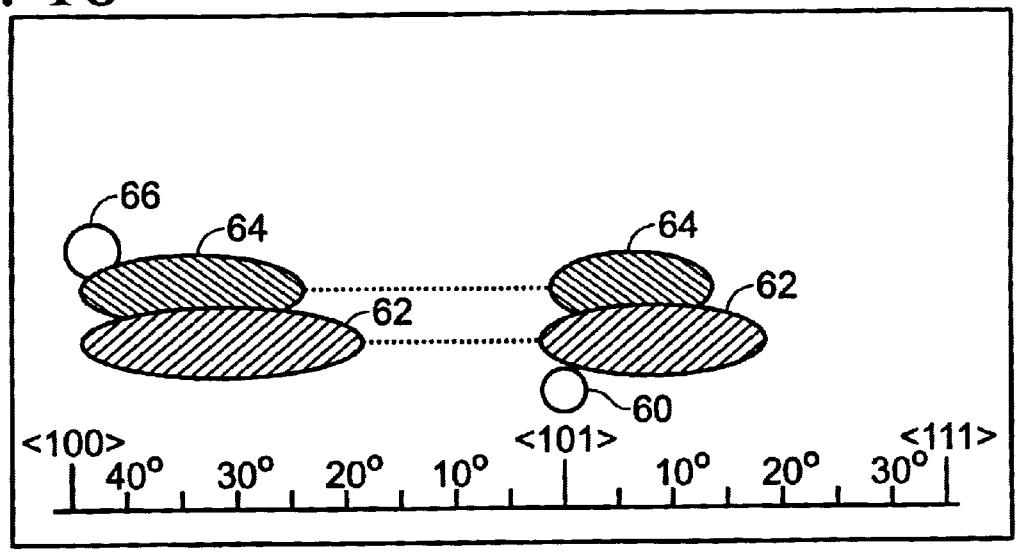
FIG. 10 is a diagram illustrating variation in crystal orientation for various film thicknesses.

FIG. 10 is a diagram illustrating variation in crystal orientation for various film thicknesses. A first thickness 60, which corresponds to an approximately 35 nm thick film, has a <110> orientation to within less than 10 degrees. A second film thickness 62, which corresponds to an approximately 45 nm thick film, has a mix of <100> orientation to within 25 degrees and <101> orientation to within approximately 20 degrees. A third film thickness 64, which corresponds to an approximately 75 nm thick film, has a mix of <100> orientation to within approximately 20 degrees and <101> orientation to within approximately 15 degrees. A forth film thickness 66, which corresponds to an approximately 100 nm thick film, has a <100> orientation to within approximately 10 degrees. As used herein, the term predominant crystal orientation, or any similar phrase, refers to a material that is within less than 15 degrees of a desired crystal orientation. Looking at FIG. 10, it is apparent that it is possible to produce films with predominantly <110> orientation, or <100> orientation. <100> orientation is generally preferred for semiconductor processes because of its electrical properties. Unfortunately, to produce predominantly <100> orientation requires the formation of thicker films than those that are considered desirable for the formation of thin film transistors.

Figure 11:
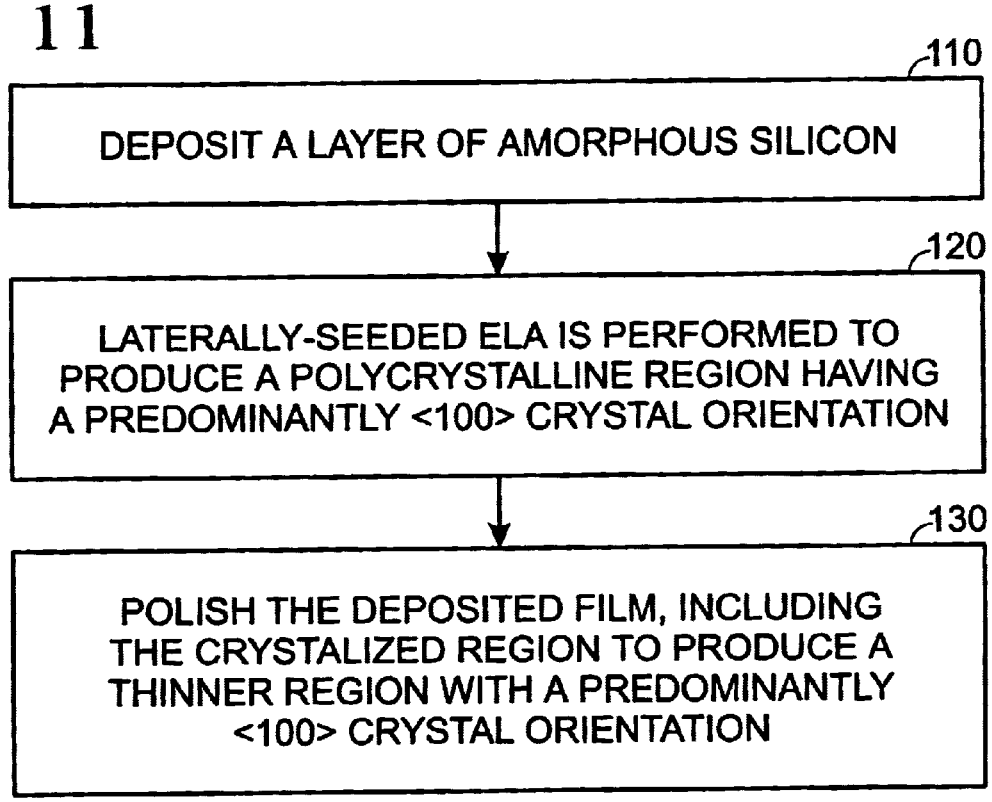
FIG. 11 is a flowchart of a process of performing the method of the present invention.

Referring now to FIG. 11, a flow chart of the steps of the method of the present invention is shown. Step 110 deposits a layer of amorphous silicon over the substrate. The layer of amorphous silicon should be thick enough to produce predominantly <100> polycrystalline silicon following subsequent processing according to the method of the present invention. The necessary thickness to produce a predominantly <100> polycrystalline material can be determined without undue experimentation. Preferably, the layer of amorphous silicon will be at least approximately 100 nm thick.

Step 120 performs lateral crystallization using LS-ELA to produce a polycrystalline region having a predominantly <100> crystal orientation. A laser beam is used to project an image of the mask onto the substrate. The laser beam energy is sufficient to cause amorphous silicon to crystallize. A sequence of laser pulses can be used to crystallize a region, as described above. The resulting polycrystalline film is predominantly <100> crystal orientation, meaning within 15 degrees of <100> crystal orientation. Preferably, the crystal orientation is within 10 degrees of <100> crystal orientation.

Step 130 polishes the crystallized silicon. It is generally preferable to use thinner layers of silicon for forming thin film transistors. Since it is necessary to deposit relatively thick layers of amorphous silicon in order to produce a predominantly <100> crystal orientation in the resulting polycrystalline film, polishing provides a mechanism for producing a film of desired thickness. Polycrystalline films are preferably less than 60 nm thick following polishing. The polishing is preferably achieved using chemical mechanical polishing (CMP).

Figure 12:
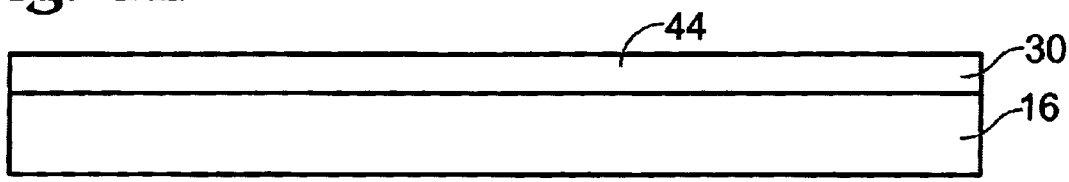
FIG. 12 is a cross-sectional view of a substrate during processing.
Figure 13:
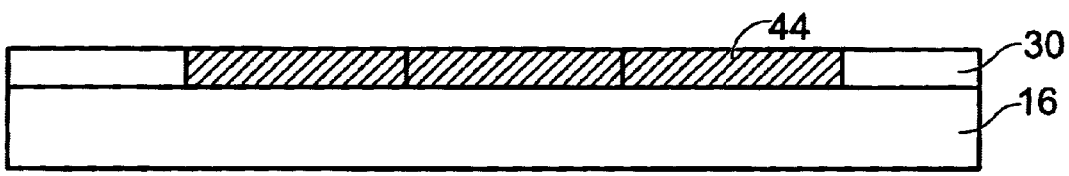
FIG. 13 is a cross-sectional view of a substrate during processing.
Figure 14:
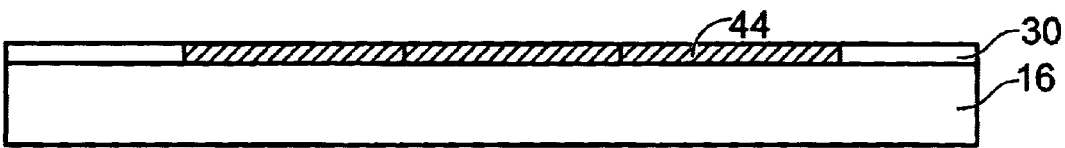
FIG. 14 is a cross-sectional view of a substrate during processing.

FIGS. 12 through 14 show the film at various stages of processing. FIG. 12 shows the substrate 16 with an overlying amorphous silicon film 30. For display applications, the substrate is preferably transparent. Available transparent substrate materials include quartz, glass, and plastic. Although it is not shown, a barrier coat may be used between the substrate and the amorphous silicon as is well known to one of ordinary skill in the art. The amorphous silicon film is preferably thick enough to form a predominantly <100> crystal orientation following LS-ELA processing. Amorphous silicon films on the order of at least approximately 100 nm will produce predominantly <100> crystal orientation. Slightly thinner films may also produce the desired result, without undue experimentation.

FIG. 13 shows a polycrystalline region 44 following the LS-ELA process, which was discussed above. The polycrystalline region 44 is predominantly <100>. By predominantly <100>, it is meant that the orientation is within 15 degrees of <100> as described above with reference to FIG. 10.

FIG. 14 shows the polycrystalline region 44 following polishing. CMP is the preferred method of polishing the film, although other suitable means will be known to one of ordinary skill in the art. The polycrystalline region is preferably polished to a thickness of less than 60 nm. The substrate with its polycrystalline film is now well suited to subsequent IC processes used to form devices.

What is claimed is:

1. A method of forming polycrystalline films on a substrate comprising the steps of:

a) providing a substrate;

b) depositing an amorphous silicon film on the substrate to a thickness of at least 100 nm;

c) annealing the amorphous silicon film using a lateral crystallization process comprising a sequence of laser pulses projected through a mask having a narrow slit to project a beamlet onto the surface of the amorphous silicon film to crystallize the amorphous silicon film as the beamlet is advanced over the surface of the amorphous silicon film between successive laser pulses to produce a polycrystalline film having a predominantly <100> crystallographic orientation in the rolling direction; and d) polishing the polycrystalline film to a thickness of less than 60 nm to prepare the film for further processing.

2. The method of claim 1, wherein the substrate is transparent.

3. The method of claim 2, wherein the substrate is quartz, glass or plastic.

4. The method of claim 1, wherein the step of polishing is accomplished using chemical mechanical polishing.

5. The method of claim 1, wherein the polycrystalline film has a crystallographic orientation within 15 degrees of <100>.

6. The method of claim 1, wherein the polycrystalline film has a crystallographic orientation within 10 degrees of <100>.

* * * * *